US006628170B2

(12) United States Patent
Titus (10) Patent No.: US 6,628,170 B2
(45) Date of Patent: *Sep. 30, 2003

(54) LOW NOISE AMPLIFIER (75) Inventor: Ward S. Titus, Princeton, NJ (US)

(73) Assignee: Analog Devices, Inc., Norwood, MA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/090,686

(22) Filed: Jun. 4, 1998

(65) Prior Publication Data
US 2001/0020871 A1 Sep. 13, 2001

(51) Int. Cl.⁷ .............................. H03G 3/10; H03F 3/04
(52) U.S. Cl. ...................................... 330/278; 330/302
(58) Field of Search ................................ 330/278, 302, 330/306, 65, 66, 67, 68

(56) References Cited
U.S. PATENT DOCUMENTS 4,764,736 A * 8/1988 Usui et al. .................. 330/306
4,890,069 A * 12/1989 Duffalo et al. .............. 330/302
5,726,606 A * 3/1998 Marland ..................... 330/302

* cited by examiner

Primary Examiner—Patricia Nguyen
(74) Attorney, Agent, or Firm—Samuels, Gauthier & Stevens, LLP (57) ABSTRACT

An integrated circuit (IC) includes a variable gain high frequency low noise amplifier (LNA) that receives a high frequency input signal and comprises a variable gain amplifier and a filter. The variable gain amplifier receives gain control signals that set the amount of gain applied to the input signal to create an amplifier output signal. The filter comprises passive components including inductors, capacitors and resistors. The filter also includes parasitic inductances provided by package leads and bond leads/wires. The variable gain amplifier includes a current steering mechanism that is responsive to the gain control signals, and sets the desired amplifier gain in response to the control signals by steering the input signal between a load and the filter. The filter is constructed from package leads, bond wires and dedicated on-chip components that overcome the lack of a precise on-chip RF ground to provide the requisite isolation between the input signal and the amplifier output signal. Significantly, the filter overcomes the lack of a good ground on the IC.

20 Claims, 6 Drawing Sheets

LOW NOISE AMPLIFIER

BACKGROUND OF THE INVENTION

The invention relates to the field of broadband amplifiers, and in particular to a variable gain, high frequency, low noise amplifier.

Wireless receivers often receive low power signals at one location and high power at another location. This is particularly true for portable and automotive receivers. To account for the variation in received signal strength, these receivers typically use a low noise amplifier (LNA) to amplify received low power signals while preventing them from being overwhelmed by the internally generated receiver noise. The LNA also receives high power input signals with minimal distortion. Therefore, due to the variation in the power of received signals, the LNA is often a compromise between gain, minimum noise figure (NF) and linearity.

When the receiver is implemented with an integrated circuit (IC) that includes an RF front end on the IC, additional design constraints arise such as DC power consumption, substrate losses and package parasitics that constrain the LNA design options and receiver performance. The ability to adjust the LNA gain is useful for reducing high level input signal distortion in succeeding receiver circuits, such as the mixer without degrading the detection of low level input signals. Adjustable gain permits the use of low DC power consumption, lower linearity mixer and IF amplifier circuitry because high level input signals are not amplified or are even attenuated by the adjustable gain LNA. This increases the IC receiver's dynamic range, battery lifetime, and ultimately lowers the cost of the receiver.

As the frequency of the received signal increases, the design of a low cost variable gain LNA for an IC receiver becomes more complicated. Materials such as GaAs and other Group III-V compound technologies offer MESFET type transistors which can be used to fabricate ICs with low noise, high linearity properties. GaAs ICs can have variable gain or variable attenuation by using one or more MESFET type devices as voltage controlled variable resistors. Yet in comparison to competing silicon (Si) technologies, such as Si bipolar junction transistor (BJT) ICs, these technologies often cost more and are less mature in their ability to integrate digital circuitry and other required receiver circuitry such as low phase noise oscillators, dual modulus prescalers and analog-to-digital converters. However, Si BJT devices are not amendable to use as voltage variable resistors. Therefore, to vary gain in a Si BJT device, other circuit techniques such as current steering must be used.

To provide a low cost IC receiver, the IC receiver must include a low cost package such as SOIC and SSOP injection mold plastic packages. However, these packages are generally designed for low frequency analog and digital ICs due. The large lead lengths and bond wire inductance of these packages and low cost assembly techniques generally associated with these packages make them difficult to use in high frequency systems. Specifically, at high frequency these packages generally have greater signal attenuation, poorer RF isolation and grounds. Poor RF isolation and grounding at high frequency make it difficult to achieve a large adjustable gain range from any type of variable gain circuitry, including the current steering method.

Therefore, there is a need for a low cost integrated circuit receiver that includes a variable gain low noise amplifier capable of operating at high frequency.

SUMMARY OF THE INVENTION

An object of the present invention is to provide a variable gain high frequency integrated circuit receiver.

A further object is to provide a variable gain high frequency low noise amplifier.

Briefly, according to the present invention, an integrated electronic device includes a variable gain amplifier and a filter. The device receives a high frequency input signal that is input to variable gain amplifier which also receives gain control signals that set the amount of gain applied to the input signal to create an amplifier output signal. The filter comprises passive components including inductors, capacitors and resistors. The filter also includes parasitic inductances provided by package leads and bond leads/wires.

The variable gain amplifier includes a current steering mechanism that is responsive to the gain control signals, and sets the desired amplifier gain in response to the control signals. The gain may be less than one. In a preferred embodiment, the steering mechanism includes parallel connected NPN transistors in cascode that steer the input signal between a load and the filter that isolates the high frequency input signal from the amplifier output signal.

The filter is constructed from package leads, bond wires and dedicated on-chip components that overcome the lack of a precise on-chip RF ground to provide the requisite isolation between the input signal and the amplifier output signal.

Advantageously, the filter of the variable gain high frequency LNA overcomes the lack of a good ground on the IC.

These and other objects, features and advantages of the present invention will become apparent in light of the following detailed description of preferred embodiments thereof, as illustrated in the accompanying drawings.

DETAILED DESCRIPTION OF THE INVENTION

Figure 1:
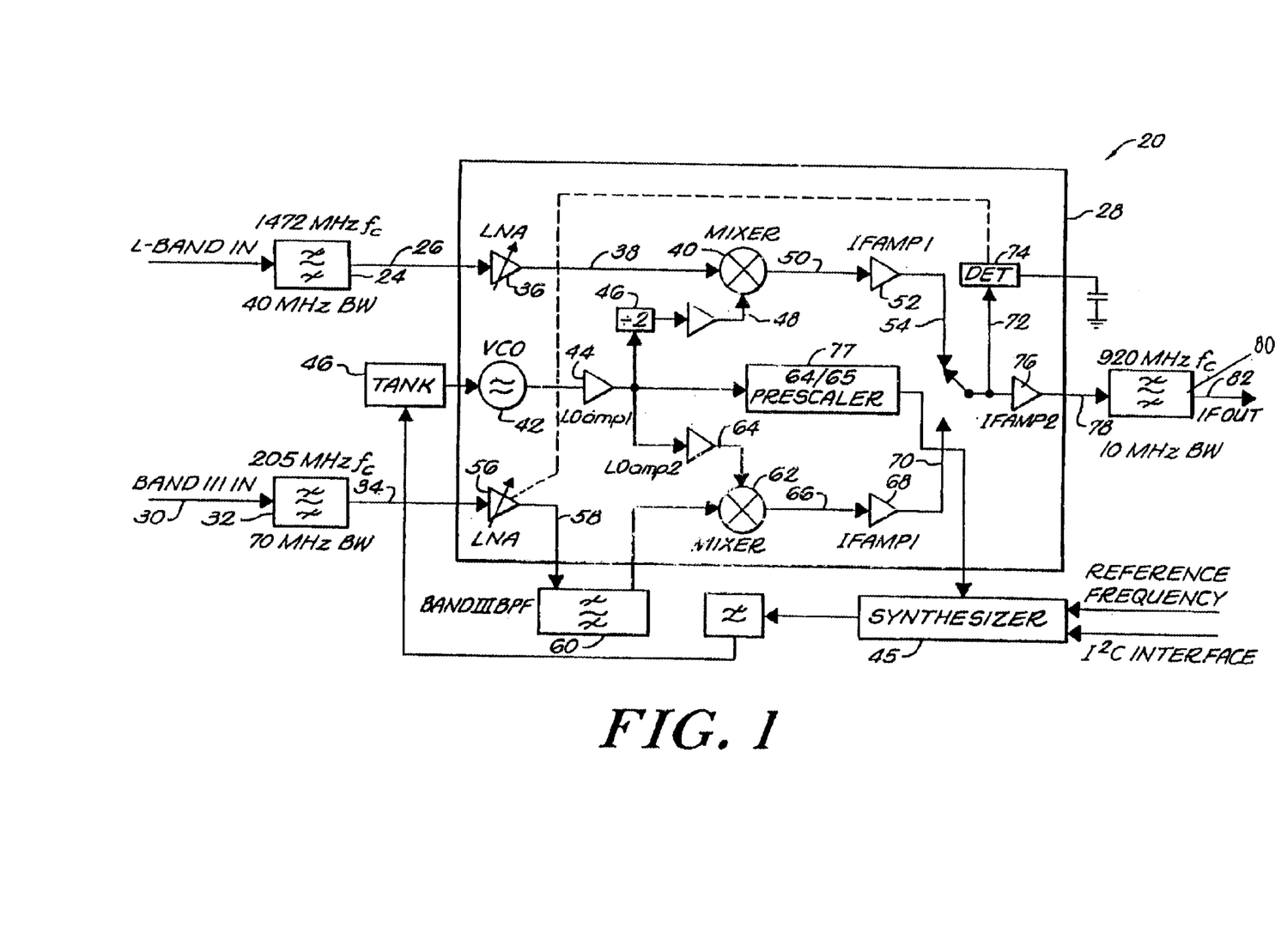
FIG. 1 is a functional block diagram illustration of a dual band integrated circuit receiver.

FIG. 1 is a functional block diagram illustration of a portion of a dual band RF receiver 20 suitable for use with a digital audio broadcast (DAB) system. The portion of the receiver is part of a chip set that provides a complete RF receiver for terrestrial and satellite broadcast DAB systems. The portion of the receiver 20 converts a high frequency signal (e.g., L-Band, 1452–1492 MHz) signals and a lower frequency signals (e.g., Band III, 170–240 MHz) between −97 and −5 dBm to a common intermediate frequency (IF) signal (e.g., 920 MHz).

The receiver 20 receives the high frequency signal (e.g., 1.472 GHz) on a line 22 which is input to a bandpass filter 24. The filter 24 has a bandwidth of approximately 40 MHz and a center frequency of 1.472 GHz, and provides a filtered signal on a line 26 that is input to an integrated circuit (IC) 28. The receiver receives the lower frequency signal on a line 30 that is input to a bandpass filter 32. Bandpass filter 32 has a bandwidth of approximately 70 MHz and a center frequency of about 205 MHz. The bandpass filter 32 provides a filtered signal on a line 34 to the IC 28.

The IC 28 includes a variable gain low noise amplifier (LNA) 36 that provides a gain adjusted signal on a line 38 to a mixer 40 (e.g., a high linearity modified Gilbert cell). The variable gain LNA 36 shall be discussed in detail below. The IC 28 also includes a voltage controlled oscillator (VCO) 42 that provides a signal (e.g., 1064–1160 MHz) to a buffer amplifier 44. The VCO operates as a tunable local oscillator by phase locking the VCO with a programmable frequency synthesizer 45 (e.g., a CMOS Plessey NJ88C33). The VCO employs a pair of cross coupled collector, differentially connected, bipolar transistors (not shown) to realize a balanced oscillator coupled to an external LC tank 46. The tank 46 includes an inductance provided by a lead/bond inductance, and either a chip inductor or a printed microstrip line. Tuning capacitance, provided by a high-Q, abrupt junction varactor diode (not shown), reduces phase noise achieving −90 dBc/Hz at 10 KHz offset for 130 MHz tuning range. The VCO 42 is biased by a regulator (not shown) that is preferably located on a companion IC (not shown). It is contemplated that the IC 28 may also include a filter (not shown) after the LNA 36 to attenuate noise generated by the LNA at the 360 MHz "image frequency".

The buffer amplifier 44 provides a buffered signal to a divide-by-two circuit 47 that generates a mixing signal on a line 48 which is input to the mixer 40. The signal on the line 48 is preferably about 532–572 MHz for the L-Band mixer 40. The mixer 40 provides a band shifted IF signal (e.g., 920 MHz) on a line 50 to a buffer 52 which provides a buffered band shifted signal on a line 54. The LNA 36, the mixer 40 and the buffer amplifiers provide about 26 dB L-Band conversion gain.

The IC 28 also includes circuitry to bandshift the lower frequency signal on the line 34 to the common IF signal (e.g., 920 MHz). Specifically, the IC includes a second variable gain low noise amplifier (LNA) 56 that provides an amplified signal on a line 58 to a bandpass filter 60 which is located off-chip. The bandpass filter 60 provides a filtered signal to a mixer 62, which mixes the signal with the signal from the VCO 42 on a line 64. The mixer 62 provides a band shifted signal on a line 66 that is input to a amplifier 68 that provides an amplified band shifted signal on a line 70. The LNA 56, the mixer 62 and the components in the Band III path provide about 28 dB total conversion gain.

Both mixers 40, 62 are preferably low current, high dynamic range modified Gilbert cell mixers that include an active class AB RF 180 degree splitter. A 9 mW DC design provides 55 to 60 dB third order intermodulation (IM3) suppression at the AGC leveled input power, near 0 dB conversion gain and 40 dB RF to IF isolation from its fully balanced topology. The mixers 40, 62 also serve as single-ended to differential converters. The IF buffers 52, 64 are two parallel emitter degenerated differential input stages, combined at common resistor loads and followed by a shared, common emitter degenerated, open collector output stage that is used to maintain high linearity at IF output powers up to about −10 dBm.

In one embodiment, the IC 28 is a dual band receiver which selects between the first band shifted signal on the line 54 and the second band shifted signal on the line 70, and provides a selected signal on a line 72 to a detector 74 and an amplifier 76. The selected signal is determined by whether the IC is operating in the high frequency mode or the lower frequency mode. Switching between the high frequency and low frequency paths is done by selectively powering down the components in the unused path with a resulting isolation of greater than 60 dB for input powers up to 0 dBm. In addition, the RF circuits on the IC preferably use band gap references and PTAT bias circuits to maintain constant circuit gain over temperature.

The IC 28 also includes a divide by $^{64}\!/_{65}$ prescaler circuit 77 that in one embodiment is realized using a plurality (e.g., three) of level balanced emitter coupled logic gates with CTAT biasing. The prescaler circuit 77 includes a high speed divide by $^{2}\!/_{3}$ (not shown) using a pulse swallowing technique is followed by a series connected divide by thirty-two flip-flop circuit (not shown). Separate prescaler 3.5V Vcc and ground package leads (not shown) are used to minimize spurious leakage to other integrated analog circuits that may degrade sensitivity. Measurement of the highest prescaler harmonic leakage to L-Band input, the $85^{th}$, is −109 dBm, well below the −97 dBm receiver sensitivity for a 8 dB C/N. For Band III, the highest prescaler harmonic leakage, the $12^{th}$, is −98 dBm, which is nearly equal the weakest receive signal. Fortunately, the discreet multi-tone (DMT) modulation and digital forward error correction schemes employed by DAB receivers make it insensitive to information lost from a single carrier or tone, a feature also important for its insensitivity to multi-path propagation effects.

The detector 74 samples the signal power at the IF frequency, converts that power to a voltage and references the voltage to an on chip voltage in order to control the gain of the LNA 36. The amplifier 76 provides a signal on a line 78 to a bandpass filter 80 having a pass band of approximately 10 MHz centered at 920 MHz. The filter 80 is preferably a surface acoustic wave (SAW) device and provides an output signal on a line 82. The detector 74 also controls the gain of the Band III LNA 56.

In general, both variable gain LNAs 36, 56 (FIG. 1) include degenerated common emitter transconductance stages that employ current steering to adjust between 20 dB maximum and −15 dB minimum gain. Single ended rather than differential designs are used to achieve reduced/minimum NF, provide direct connection to a diplexer and avoid costly external balanced to unbalanced converters (Baluns). Both LNAs use either a diplexer or a low cost off-chip capacitor for input DC blocking to avoid additional NF degradation.

Figure 2:
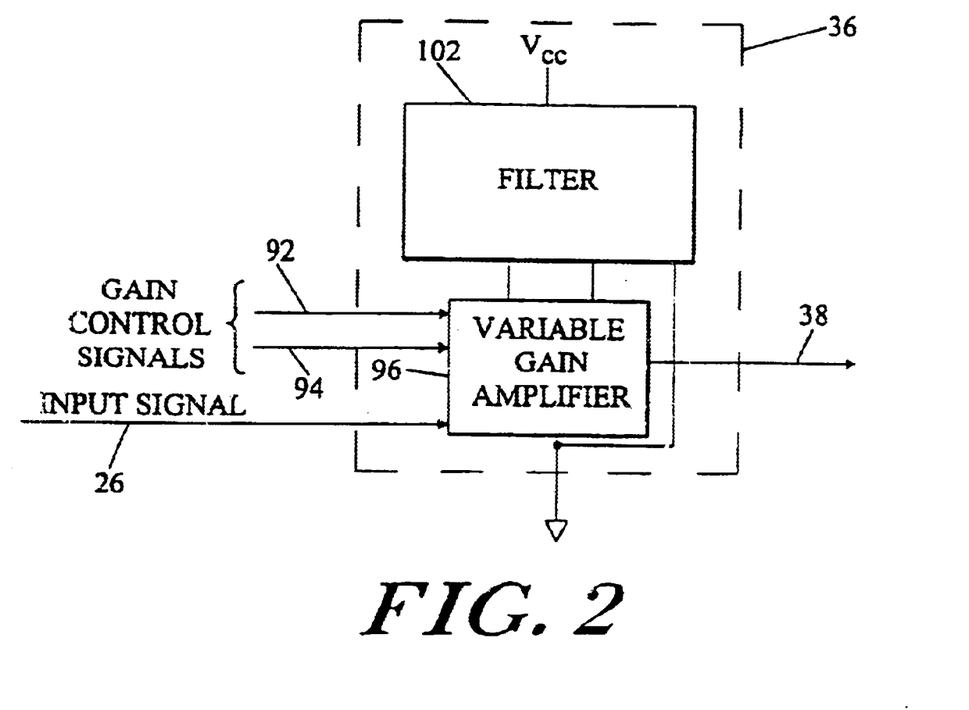
FIG. 2 is a functional block diagram illustration of a variable gain high frequency low noise amplifier.

FIG. 2 illustrates a functional block diagram of the variable gain LNA 36. The LNA receives the input signal on the line 26, and gain control signals on lines 92, 94 from the detector 74 (FIG. 1). These signals are input to a variable gain amplifier 96. The LNA 36 also includes a novel filter 102 which provides the necessary attenuation for high frequency operation of the IC 28 (FIG. 1).

According to the present invention, the variable gain LNA 36 includes a filter comprising package leads, bond wires and dedicated on chip components which overcome the lack of a precise on-chip RF ground that is generally required for good isolation at high frequencies. In general, high frequency includes frequencies greater than about 500 MHz. Both LNAs preferably have about a 2.4 dB noise figure (NF), 20 dB gain, variable gain ranges of more than 30 dB and more than 40 dB IM3 suppression. We shall now discuss the details of the variable gain LNA 36.

Figure 3:
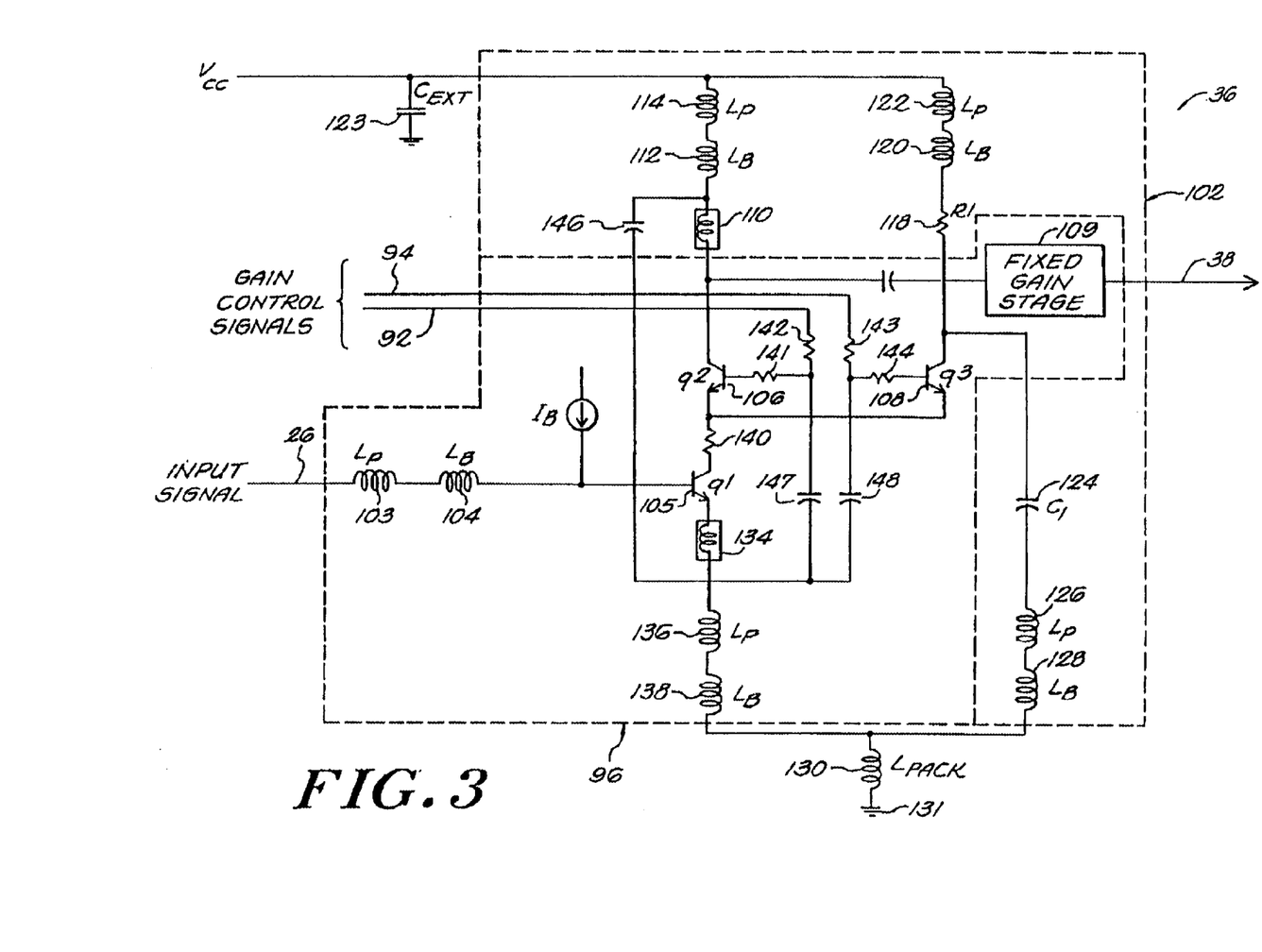
FIG. 3 is a schematic illustration of the variable gain high frequency low noise amplifier of FIG. 2.

FIG. 3 is a schematic illustration of the variable gain LNA 36. The input signal on the line 26 is input to the variable gain amplifier 96 that includes a package lead inductance $L_p$ 103 (e.g., 0.7 nH), and a bond wire inductance $L_B$ 104 (e.g., 1–2 nH) and a amplifying transistor 105. The value of $L_B$ 104 is selected to assist the amplifying transistor 105 in achieving improved gain and NF. The inductances associated with the bond wire and the package lead are not dedicated discrete inductances, but rather, represent the inductances associated with the bond wire and package lead that carry the input signal on the line 26 from the package lead to the base of the transistor 105. The variable gain amplifier 96 also includes current steering transistors 106, 108 that switch the input signal between minimum and maximum gain states, or continuously adjust the gain between these limits, under the control of the detector 74 (FIG. 1). The gain is controlled via gain control signals 92, 94 which are applied to the base of transistors 106, 108 respectively. The gain may be less than one. The variable gain amplifier 96 also includes a fixed gain stage 109 that provides a fixed amount of signal gain and provides the gain adjusted signal on the line 38.

The collector of the transistor 106 is connected to voltage signal $V_{cc}$ through an inductor 110 (e.g., planar spiral) and via package and bond leads which include inherent inductances $L_B$ 112, $L_p$ 114 respectively. The collector of the transistor 108 is connected to the voltage signal $V_{cc}$ through a resistor $R_1$ 118 and a bond wire and package lead which provide a bond wire inductance $L_B$ 120 and a package inductance $L_p$ 122, respectively. Again, the inductances associated with the bond wires and the package leads are not dedicated discrete inductances, but rather, represent the inherent inductances associated with the selected bond wire and package lead. Capacitor $C_{EXT}$ 123 filters the voltage signal $V_{cc}$ to reduce high frequency noise. Significantly, the transistors 106, 108 are arranged in a cascode configuration to steer the input signal on the line 26 between the load (i.e., the inductor 110) and the filter 102 which overcomes the lack of a precise on chip high frequency ground that is otherwise required for isolation at high frequencies.

The filter 102 also includes a capacitor $C_1$ 124 and parasitic inductances $L_p$ 126, $L_B$ 128 and $L_{pack}$ 130. These parasitic inductances are associated with the bond wire and package leads that provide a path to ground connection 131. The parasitic inductance $L_{pack}$ 130 is common to the variable gain amplifier 96 and the filter 102. The emitter of the switching transistor 105 is connected to ground 131 through an inductor 134 (e.g., planar spiral) and parasitic inductances, $L_p$ 136, $L_B$ 138. The LNA 36 also includes a plurality of biasing resistors 140–144 and filtering capacitors 146–148.

Significantly, the characteristics of the bond wire and package leads are selected to provide the desired parasitic inductances $L_p$, $L_B$ and $L_{PACK}$ for the LNA 36. For example, the length and number of bond wires between a package lead and the IC are selected based upon the desired bond wire inductance $L_B$. Similarly, the characteristics of the package leads and the package are selected to provide the desired parasitic inductances $L_p$ and $L_{PACK}$. One of ordinary skill will recognize that the parasitic inductances $L_p$ and $L_B$ may be mutually coupled, and that this coupling should be taken into account when modeling the system to determine optimum values for the parasitic inductances based upon the selected IC and package.

Figure 4:
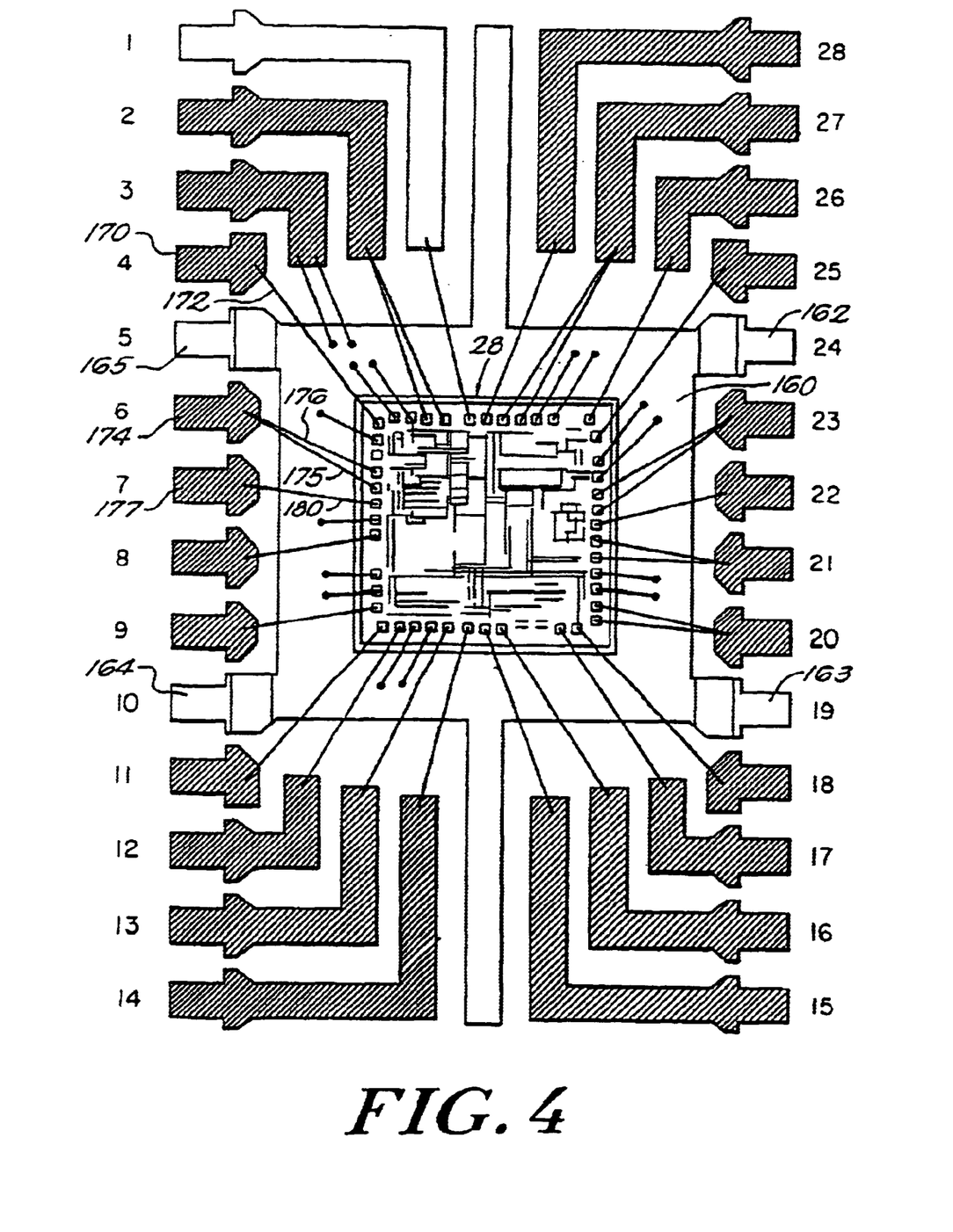
FIG. 4 illustrates a layout of the integrated circuit including the leads.

FIG. 4 illustrates a layout of the IC 28 in a fused lead package. The IC 28 is attached to a metallic paddle 160 that is connected to ground via package leads 162–165. The four leads 162–165 are preferably fused to the paddle 160. Alternatively, the four leads 162–165 may be connected to the paddle 160 via a plurality of bond wires. In one embodiment, the IC 28 is 88×88 mils and implemented in a 25 GHz $f_T$ NPN bipolar process, assembled into a fused lead plastic twenty-eight pin SSOP package using one mil wire bonds. The common paddle ground with multiple chip-to-paddle down bonds and the four fused ground leads 162–165 are used to reduce/minimize ground inductance and conserve package leads. Significantly, longer signal and Vcc bond wires, normally undesirable, resulting from down bonds to the paddle ground, are incorporated to enhance the L-Band variable gain LNA operation and performance by providing the desired parasitic inductances.

Referring to FIGS. 3–4, the package inductance $L_p$ 103 is associated with package lead 170 and the bond inductance $L_b$ 104 is the inductance of bond wire 172. Similarly, the package inductance $L_p$ 114 is the inductance of package lead 174 and the bond wire inductance $L_b$ 112 is the inductance of bond wires 175, 176. In addition, the package inductance 112 is the inductance of the package lead 177, and the bond inductance 120 is the inductance of the bond wire 180. The package inductance $L_{pack}$ 130 is the parallel inductance of the leads 162–165.

The planar spiral inductors have a relatively low Q (e.g., Q=3, 1.5 GHz) and the bond wires generally have a higher Q (e.g., Q=60). The spiral inductors and the bond wires are used for emitter degeneration, series feedback and reactive gain/noise matching. The higher Q of the package leads (e.g., Q=300) and bond wires helps to improve the otherwise low Q achieved from the on-chip spiral inductors alone. In one embodiment, the planar spiral inductors are implemented in top level metal having a 10 $\mu$m width and 2 $\mu$m spacing, and vary in value from about 1 nH to 6 nH. The combined package lead $L_p$ and bond inductance $L_B$ varies from about 0.6 nH to about 4 nH.

Figure 5:
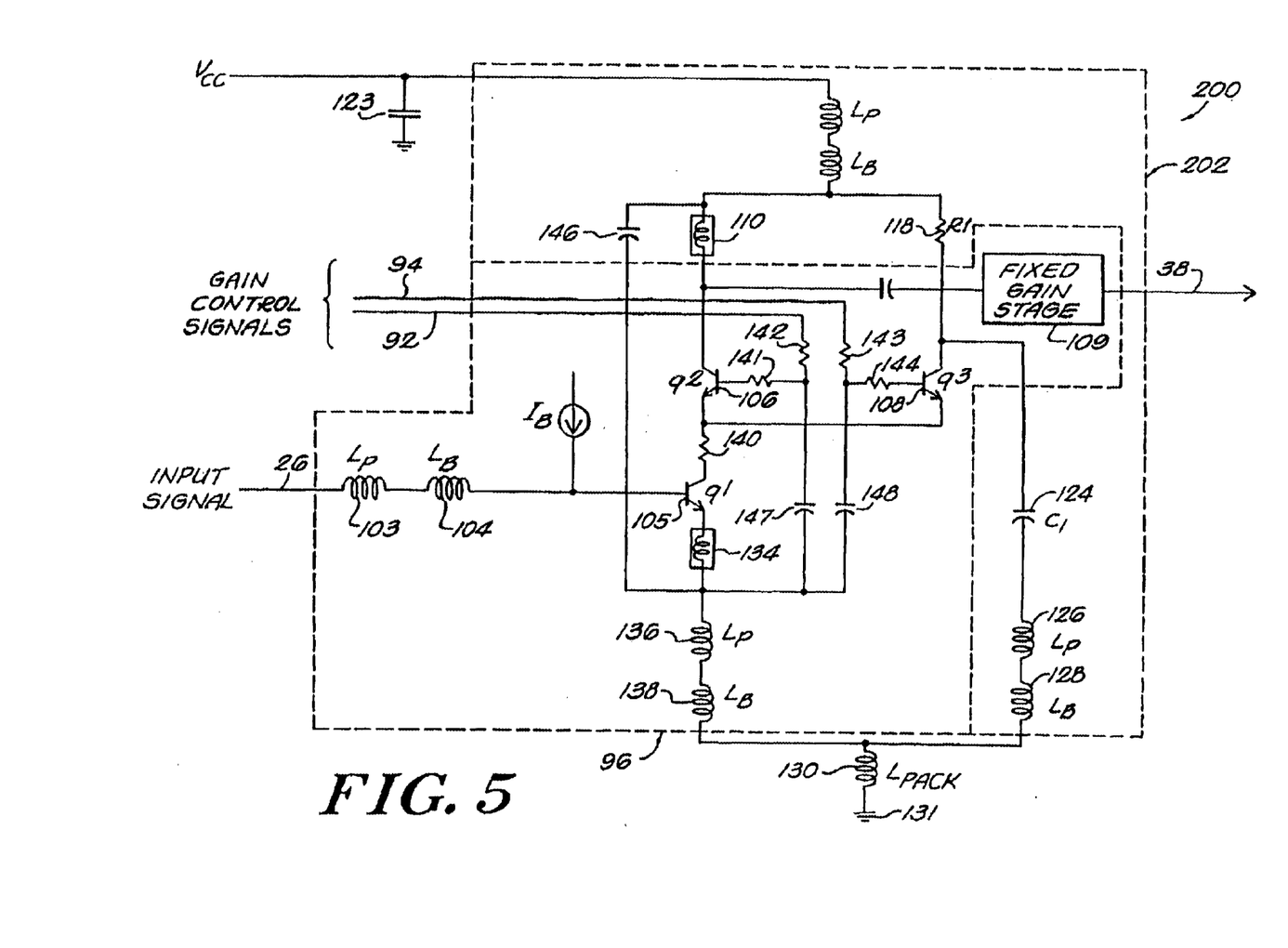
FIG. 5 is a schematic illustration of an alternative embodiment variable gain high frequency low noise amplifier.

FIG. 5 is a schematic illustration of an alternative embodiment variable gain high frequency LNA 200. This LNA 200 is substantially the same as the LNA 36 (FIG. 3) with the principal exception that the collectors of transistors 106, 108 are mutually coupled to the voltage signal Vcc. That is, the same package lead and bond wire(s) are used to route Vcc to both transistors 106, 108 and the connection between the transistors is made on-chip. In this embodiment, the value of the resistor $R_1$ 118 has to be slightly greater and the capacitor $C_{ext}$ 123 should also be slightly larger. This ensures more of the signal is sent towards the paddle 160 (FIG. 4), rather than towards the Vcc connection.

Figure 6:
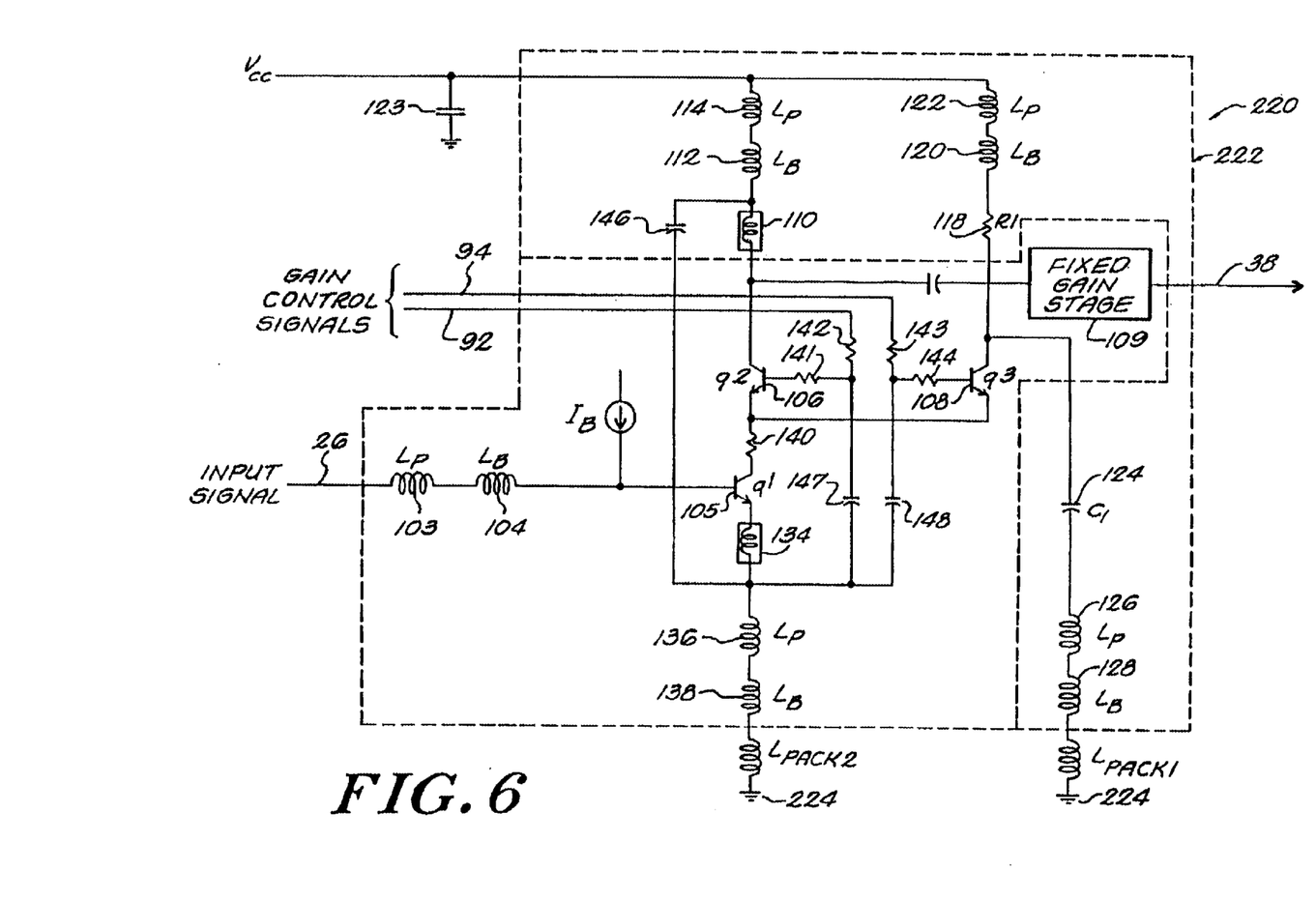
FIG. 6 is a schematic illustration of yet another alternative embodiment variable gain high frequency low noise amplifier.

FIG. 6 is a schematic illustration of yet another alternative embodiment variable gain high frequency LNA 220. This LNA 220 is also substantially the same as the LNA 36 (FIG. 3) with the principal exception that the connections to ground are no longer mutually coupled. Specifically, separate leads and bond wires are used to provide a separate path to ground for the capacitor $C_1$ 124 and the inductor 134, where they are then independently connected to a ground 224 on the board. In this embodiment the paddle 160 (FIG. 4) is not required. In addition, since having a common paddle lowers the parasitic inductances in the paths to ground, this embodiment provides larger parasitic ground path inductance for greater isolation between those two ground points. This also allows more signal to be steered towards the ground 224 rather than towards the Vcc connection. In this embodiment, the value of the inductor 134 is reduced in contrast to the previous embodiments in order to maintain gain.

One of ordinary skill will recognize that although the present invention has been discussed in the context of a bipolar device, it is generally applicable to any device which produces current gain, including GaAs and silicon CMOS devices. In addition, it is contemplated that the present invention may be used in power amps, and translation devices such as a mixer. Furthermore, the present invention is not limited to SSOP packages. Packages such as SOIC, TQFP and MSOP may be used. Ceramic packages may also be used. In general, a preferred package is low cost and provides sufficient high frequency parasitic inductance for the filter. It is further contemplated that a package may not even be required, and the IC may be mounted to a board using flip-chip bonding techniques since the solder bumps may provide sufficient inductance at high frequency for the filter.

Although the present invention has been shown and described with respect to several preferred embodiments thereof, various changes, omissions and additions to the form and detail thereof, may be made therein, without departing from the spirit and scope of the invention.

What is claimed is:

1. A bipolar integrated electronic device, comprising:
   a variable gain amplifier that receives an input signal and gain control signals, and amplifies said input signal to provide an amplifier output signal, wherein the amount said amplifier output signal is amplified is controlled by said gain control signal values; and
   a filter which isolates said amplifier output signal and said input signal, wherein said filter comprises package lead parasitic inductances and a plurality of discrete integrated passive components.

2. The bipolar integrated electronic device of claim 1, wherein said variable gain amplifier includes a plurality of transistors arranged in cascode and responsive to said gain control signals.

3. The bipolar integrated electronic device of claim 1, wherein said variable gain amplifier comprises means for current steering responsive to said gain control signals, to route said input signal between said filter and a load to provide said amplifier output signal with a desired amount of gain.

4. The bipolar integrated electronic device of claim 2, wherein said input signal is a high frequency signal.

5. The bipolar integrated electronic device of claim 3, wherein said means for current steering comprises a plurality of bipolar junction devices.

6. The bipolar integrated electronic device of claim 4, wherein the low noise amplifier is located on a silicon bipolar integrated circuit.

7. The bipolar integrated electronic device of claim 4, wherein said input signal is an L-Band signal.

8. A bipolar low noise amplifier integrated circuit, comprising:
   a variable gain amplifier that receives an input signal and gain control signals, and amplifies said input signal to provide an amplifier output signal under the control of said gain control signals; and
   filtering means for providing electrical isolation between said amplifier output signal and said input signal, wherein said filtering means includes package lead parasitic inductances, bond wire parasitic inductances and discrete integrated passive components.

9. The bipolar low noise amplifier of claim 8, wherein said input signal is an L-Band signal.

10. The bipolar low noise amplifier of claim 8, wherein said package leads and said bond wires provide a parasitic inductance of about 0.6 nH to about 4 nH.

11. The bipolar low noise amplifier of claim 8, wherein said variable gain amplifier comprises means for current steering responsive to said gain control signals, to route said input signal between said filter means and a load to provide said amplifier output signal with a desired amount of gain.

12. The bipolar low noise amplifier of claim 8, wherein the integrated circuit is positioned on a conductive paddle electrically connected to a circuit ground by a plurality of leads associated with an integrated circuit package that encapsulates both said integrated circuit and said conductive paddle.

13. The bipolar low noise amplifier of claim 8, wherein said integrated circuit is connected to said integrated circuit package by a plurality of bond wires.

14. The bipolar low noise amplifier of claim 8, wherein said discrete integrated passive components include a plurality of planar spiral inductors.

15. A dual band receiver integrated circuit that receives a first band signal and a second band signal, said integrated circuit comprising:
   a package;
   a high frequency variable gain amplifier which receives the first band signal and provides an amplified first band signal;
   an amplifier that receives the second band signal and provides an amplified second band signal;
   means for band shifting said first amplified signal to a first band shifted signal and for band shifting said second amplified signal to a second band shifted signal, and for selectively routing said first band shifted signal and said second band shifted signal to an output line, wherein
   said high frequency variable gain amplifier includes a passive filter that isolates the first band signal and said amplified first band signal, and includes inductances from said package and discrete integrated passive components.

16. The dual band receiver integrated circuit of claim 15, wherein the integrated circuit is a silicon bipolar device and said package includes a SSOP package.

17. An integrated electronic device, comprising:
   a variable gain amplifier that receives an input signal and gain control signals, and amplifies said input signal to provide an amplifier output signal, wherein the amount said amplifier output signal is amplified is controlled by said gain control signal values; and
   a filter which isolates said amplifier output signal and said input signal, wherein said filter comprises package lead parasitic inductances and a plurality of discrete integrated passive components,
   wherein said variable gain amplifier comprises means for current steering responsive to said gain control signals, to route said input signal between said filter and a load to provide said amplifier output signal with a desired amount of gain.

18. The integrated electronic device of claim 17, wherein said integrated electronic device is bipolar.

19. A low noise amplifier integrated circuit, comprising:
   a variable gain amplifier that receives an input signal and gain control signals, and amplifies said input signal to provide an amplifier output signal under the control of said gain control signals; and
   filtering means for providing electrical isolation between said amplifier output signal and said input signal, wherein said filtering means includes package lead parasitic inductances, bond wire parasitic inductances and discrete integrated passive components,
   wherein said variable gain amplifier comprises means for current steering responsive to said gain control signals, to route said input signal between said filter means and a load to provide said amplifier output signal with a desired amount of gain.

20. The low noise amplifier integrated circuit of claim 19, wherein said low noise amplifier integrated circuit is a bipolar device.

* * * * *